(12) United States Patent
Moriguchi et al.

(10) Patent No.: US 8,174,013 B2
(45) Date of Patent: May 8, 2012

(54) SEMICONDUCTOR DEVICE, METHOD FOR MANUFACTURING THE SEMICONDUCTOR DEVICE, AND DISPLAY DEVICE

(75) Inventors: Masao Moriguchi, Nara (JP); Yuichi Saito, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 564 days.

(21) Appl. No.: 12/306,647

(22) PCT Filed: Aug. 3, 2007

(86) PCT No.: PCT/JP2007/065287
§ 371 (c)(1),
(2), (4) Date: Dec. 24, 2008

(87) PCT Pub. No.: WO2008/029582
PCT Pub. Date: Mar. 13, 2008

(65) Prior Publication Data
US 2009/0309100 A1    Dec. 17, 2009

(30) Foreign Application Priority Data
Sep. 8, 2006    (JP) ................................ 2006-244285

(51) Int. Cl.
*H01L 33/00*    (2010.01)
(52) U.S. Cl. ................... 257/59; 257/72; 257/E21.133; 257/E29.291

(58) Field of Classification Search ............... 257/59, 257/57, E29.291, E33.004, E21.414, 66, 257/72, 347, 350, E21.133, E21.134, E21.197, 257/E29.293
See application file for complete search history.

(56) References Cited

U.S. PATENT DOCUMENTS

| 5,728,610 | A | * | 3/1998 | Gosain et al. | 438/162 |
| 6,150,251 | A | * | 11/2000 | Yew et al. | 438/592 |
| 6,506,635 | B1 | * | 1/2003 | Yamazaki et al. | 438/148 |
| 7,507,615 | B2 | * | 3/2009 | Yamazaki et al. | 438/158 |
| 2002/0182828 | A1 | * | 12/2002 | Asami et al. | 438/485 |
| 2005/0095850 | A1 | | 5/2005 | Adachi et al. | |

FOREIGN PATENT DOCUMENTS

| CN | 1455441 A | 11/2003 |
| JP | 62-295465 A | 12/1987 |
| JP | 03-080569 A | 4/1991 |
| JP | 03080569 * | 4/1991 |
| JP | 05-226656 A | 9/1993 |
| JP | 07-193249 A | 7/1995 |
| JP | 7-263698 A | 10/1995 |
| JP | 2001-217424 A | 8/2001 |

* cited by examiner

*Primary Examiner* — Davienne Monbleau
*Assistant Examiner* — Fazli Erdem
(74) *Attorney, Agent, or Firm* — Birch, Stewart, Kolasch & Birch, LLP (57) ABSTRACT

A semiconductor device includes a semiconductor layer having a channel region, an impurity layer having a source region and a drain region, and a gate electrode provided so as to face the semiconductor layer with a gate insulating film interposed therebetween. The semiconductor layer has a layered structure of at least a first amorphous film and a crystalline film including a crystal phase, and the first amorphous film is formed directly on the gate insulating film.

22 Claims, 10 Drawing Sheets

SEMICONDUCTOR DEVICE, METHOD FOR MANUFACTURING THE SEMICONDUCTOR DEVICE, AND DISPLAY DEVICE

BACKGROUND OF THE INVENTION

1. Field of the Invention

The present invention relates to a semiconductor device and a manufacturing method thereof, and a display device having the semiconductor device.

2. Description of the Related Art

Thin film transistors (hereinafter, referred to as TFTs) have been known as a semiconductor device. TFTs are used preferably to drive display devices such as a liquid crystal display device and an organic EL display device.

Especially a-Si TFTs having a channel region made of only an amorphous film such as amorphous silicon (a-Si) have been most commonly used in the industry. A so-called channel etch type TFT (Conventional structure 1) will now be described with reference to an enlarged cross-sectional view of FIG. 17. A TFT 100 has a gate electrode 102 formed on a substrate 101, a gate insulating film 103 covering the gate electrode 102, an a-Si layer 104 formed on the gate insulating film 103 to form a channel region, a source region 105 and a drain region 106 which are made of an n+-Si layer patterned on the a-Si layer 104, a source electrode 107 covering the source region 105, and a drain electrode 108 covering the drain region 106.

Figure 17:
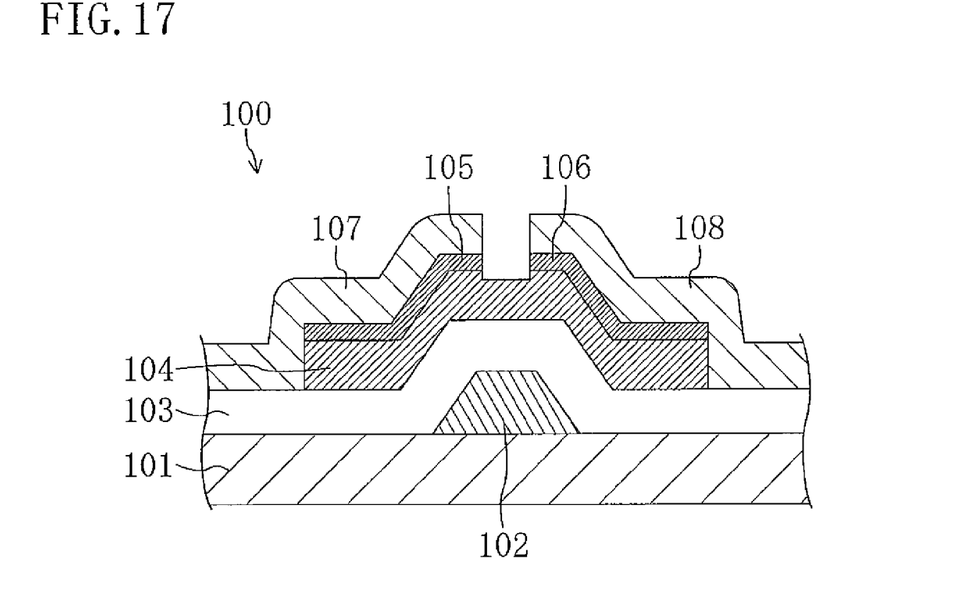
FIG. 17 is an enlarged cross-sectional view showing a structure of a conventional TFT.

Since the channel region is made of an amorphous film, the a-Si TFT of Conventional structure 1 has a mobility of about 0.2 to 0.5 cm²/Vs and has relatively poor on-state characteristics. On the other hand, since the gate insulating film is made of a silicon nitride film, the gate insulating film has excellent interface characteristics with the a-Si layer 104 of the channel region, thereby improving the rising characteristics (S value) of an on-state current. Moreover, the a-Si layer 104 has a wide bandgap and therefore a leakage current (off-state current) is small. A leakage current is reduced also at the interface between the a-Si layer 104 and the source region 105 and the drain region 106.

A TFT (Conventional structure 2) having a channel region made of only a film having a crystal layer (microcrystalline silicon film) is also known in the art. The TFT has the same structure as that of the above a-Si TFT except that the channel region is made of a microcrystalline silicon film and the gate insulating film is made of a silicon nitride film or a silicon oxide film. Since the channel region has a crystalline property, this TFT has a mobility of 1 to 3 cm²/Vs and has improved on-state characteristics.

However, since the microcrystalline silicon film (the channel region) has a multiplicity of defect levels, the microcrystalline silicon film has poor characteristics at a junction interface with the n+-Si layer (the source region and the drain region). In other words, the microcrystalline silicon film has a lower electric resistance and a narrower bandgap than the a-Si layer, and therefore has a larger off-state current than the a-Si layer.

Moreover, the microcrystalline silicon film (the channel region) has a mixed structure of crystalline silicon and amorphous silicon. Accordingly, an excellent interface cannot be obtained regardless of whether the gate insulating film is made of a silicon oxide film or a silicon nitride film. In other words, a fixed charge density and an interface state density become extremely high, and an extreme negative shift of the TFT threshold voltage and degradation in S value will become a problem. Moreover, since the manufacturing process becomes very unstable, it is difficult to control the threshold voltage.

Hereinafter, the TFTs of Conventional structures 1 and 2 will be described with reference to a graph of voltage-current characteristics shown in FIG. 19. Solid line in FIG. 19 indicates a change in current value with increase in applied voltage in the TFT of Conventional structure 1 (the channel region is an a-Si layer and the gate insulating film is SiNx). When the applied voltage is in the range of −40 to −10 V, the current value varies significantly at about $10^{-12}$ A or less. When the applied voltage becomes higher than −10 V, an on-state current rises and increases rapidly. As can be seen from the graph, the on-state current then asymptotically increases to about $10^{-2}$ A with increase in applied voltage.

Figure 19:
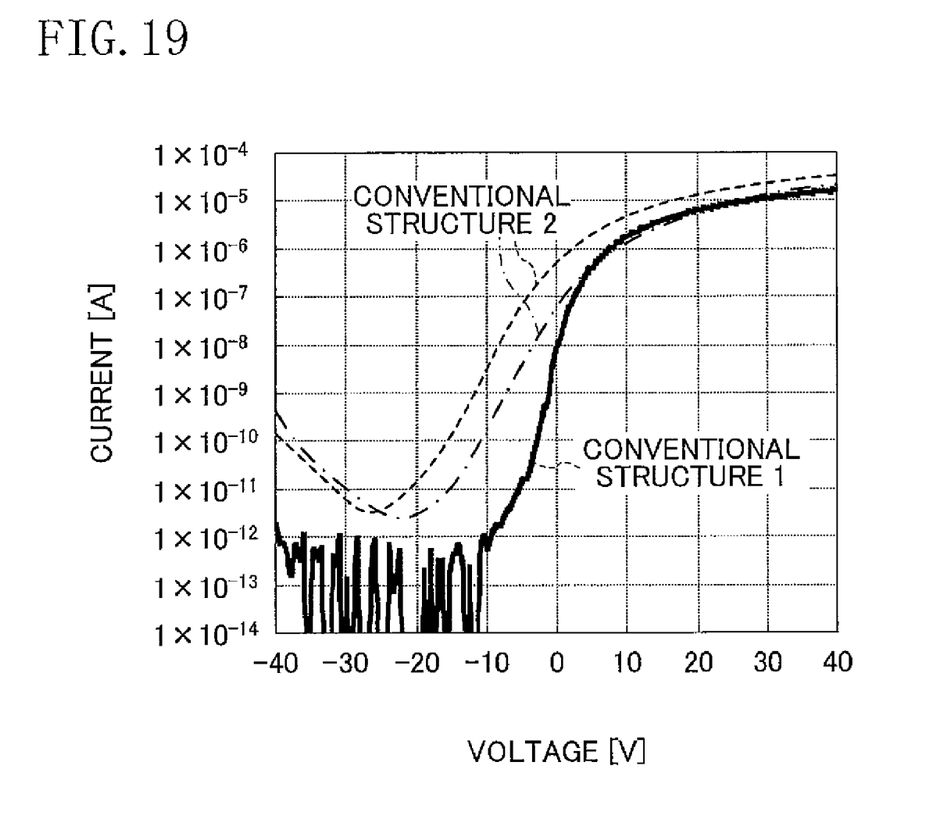
FIG. 19 is a graph showing voltage-current characteristics of conventional TFTs.

Similarly, chain line in FIG. 19 indicates a change in current value with increase in applied voltage in the TFT of Conventional structure 2 (the channel region is a microcrystalline silicon layer and the gate insulating film is SiNx). The current value decreases monotonously when the applied voltage is in the range of −40 to −22 V. As can be seen from the figure, with increase in applied voltage, the current value then increases and an on-state current rises and asymptotically increases to about $10^{-2}$ A.

Similarly, dashed line in FIG. 19 indicates a change in current value with increase in applied voltage in the TFT of Conventional structure 2 (the channel region is a microcrystalline silicon layer and the gate insulating film is SiOx). The current value decreases monotonously when the applied voltage is in the range of −40 to −25 V. With increase in applied voltage, an on-state current rises and asymptotically increases to about $10^{-3}$ A.

It can therefore be seen that, in Conventional structure 2, an off-state current increases and rising characteristics of the current are inferior to those of Conventional structure 1 regardless of whether the gate insulating film is SiNx or SiOx.

Figure 18:
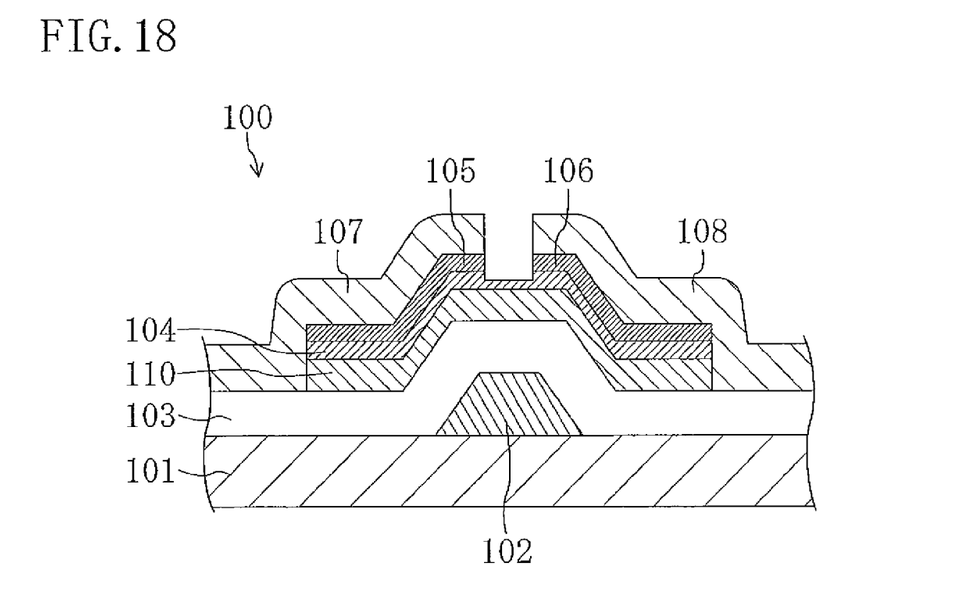
FIG. 18 is an enlarged cross-sectional view showing a structure of a conventional TFT.

As shown in a cross-sectional view of FIG. 18, it is known in the art to interpose the a-Si layer 104 between a microcrystalline silicon layer 110 and the source region 105 or the drain region 106 (e.g., see Patent documents 1 and 2). In other words, the microcrystalline silicon layer 110 is formed on the gate insulating film 103, and the a-Si layer 104 is formed on the microcrystalline silicon layer 110. The source region 105 and the drain region 106 are thus formed on the a-Si layer 104. This structure tries to solve the problem of Conventional structure 1, that is, a low mobility in the channel region.

Patent document 1: Japanese Laid-Open Patent Publication No. S62-295465
Patent document 2: Japanese Laid-Open Patent Publication No. 2001-217424

SUMMARY OF THE INVENTION

Problems to be Solved by the Invention

In the structures of Patent documents 1 and 2, however, an excellent interface cannot be obtained between the gate insulating film 103 and the microcrystalline silicon layer 110 of the channel region regardless of whether the gate insulating film 103 is SiNx or SiOx. A fixed charge density and an interface state density therefore become extremely high. As a result, an extreme negative shift of the TFT threshold voltage and degradation in S value will become a problem. Moreover, since the manufacturing process becomes very unstable, it is difficult to control the threshold voltage.

Moreover, since the high resistance a-Si layer 104 is formed on the source region 105 side and the drain region 106 side, a leakage current from the a-Si layer 104 can be reduced. However, since the microcrystalline silicon layer 110 is formed on the gate insulating film 103 side, a leakage current at the interface is not reduced, whereby an off-state current is increased.

The present invention is made in view of the above problems and it is an object of the present invention to form an excellent interface between a layer including a channel region and a gate insulating film and to improve a carrier mobility in the channel region.

Means for Solving the Problems

In order to achieve the above object, according to the present invention, a semiconductor layer having a channel region is formed as a layered structure of a first amorphous film formed directly on a gate insulating film and a crystalline film.

More specifically, a semiconductor device according to the present invention includes a semiconductor layer having a channel region, an impurity layer having a source region and a drain region, and a gate electrode provided so as to face the semiconductor layer with a gate insulating film interposed therebetween. The semiconductor layer has a layered structure of at least a first amorphous film and a crystalline film including a crystal phase, and the first amorphous film is formed directly on the gate insulating film.

Preferably, at least one layer of a second amorphous film is formed between the crystalline film and the impurity layer.

The gate electrode may be formed on an insulating substrate, and the semiconductor device may have a bottom gate structure in which the semiconductor layer is formed over the insulating substrate so as to cover the gate electrode and at least a part of the gate insulating film.

Preferably, the semiconductor layer is made of silicon.

Preferably, the crystalline film is made of microcrystalline silicon of a columnar crystal extending perpendicularly to a surface of the crystalline film.

Preferably, the columnar crystal has a diameter of 10 nm to 40 nm in cross section.

Preferably, the first amorphous layer is made of amorphous silicon.

The gate insulating film may be made of a silicon nitride film.

Preferably, the first amorphous film has a thickness of 5 nm to 30 nm.

Preferably, the impurity layer has a layered structure of at least an amorphous first layer and a second layer including a crystal phase.

The impurity layer may have a layered structure of at least a low impurity layer and a high impurity layer.

Preferably, a spectrum of the first amorphous film detected by an FT-IR method has an absorption peak at 2,000 cm$^{-1}$ and an absorption peak at 2,100 cm$^{-1}$, and a ratio of the absorption peak at 2,000 cm$^{-1}$ in the detected spectrum is 75% or higher.

A display device according to the present invention includes a first substrate having a plurality of thin film transistors formed thereon, and a second substrate provided so as to face the first substrate with a display medium interposed therebetween. Each of the thin film transistors includes a semiconductor layer having a channel region, an impurity layer having a source region and a drain region, and a gate electrode provided so as to face the semiconductor layer with a gate insulating film interposed therebetween. The semiconductor layer has a layered structure of at least a first amorphous film and a crystalline film including a crystal phase, and the first amorphous film is formed directly on the gate insulating film.

Preferably, at least one layer of a second amorphous film is formed between the crystalline film and the impurity layer.

The gate electrode may be formed on an insulating substrate, and each of the plurality of thin film transistors may have a bottom gate structure in which the semiconductor layer is formed over the insulating substrate so as to cover the gate electrode and at least a part of the gate insulating film.

Preferably, the semiconductor layer is made of silicon.

Preferably, the crystalline film is made of microcrystalline silicon of a columnar crystal extending perpendicularly to a surface of the crystalline film.

Preferably, the columnar crystal has a diameter of 10 nm to 40 nm in cross section.

Preferably, the first amorphous layer is made of amorphous silicon.

The gate insulating film may be made of a silicon nitride film.

Preferably, the first amorphous film has a thickness of 5 nm to 30 nm.

Preferably, the impurity layer has a layered structure of at least an amorphous first layer and a second layer including a crystal phase.

The impurity layer may have a layered structure of at least a low impurity layer and a high impurity layer.

Preferably, a spectrum of the first amorphous film detected by an FT-IR method has an absorption peak at 2,000 cm$^{-1}$ and an absorption peak at 2,100 cm$^{-1}$, and a ratio of the absorption peak at 2,000 cm$^{-1}$ in the detected spectrum is 75% or higher.

A method for manufacturing a semiconductor device according to the present invention includes: a first step of forming a gate electrode on an insulating substrate; a second step of forming a gate insulating film so as to cover the gate electrode; a third step of forming a semiconductor layer and an impurity layer that is a semiconductor layer containing impurities; a fourth step of etching the semiconductor layer to form an active layer; and a fifth step of etching the impurity layer to form a source region and a drain region. The third step includes a step of forming a first amorphous film so as to cover the gate insulating film, and a step of forming a crystalline film including a crystal phase so as to cover the first amorphous film.

Preferably, the third step includes a step of forming a second amorphous film so as to cover the crystalline film.

In the third step, an etch stopper portion may be formed on the semiconductor layer and the impurity layer may be formed so as to cover the semiconductor layer and the etch stopper portion.

Preferably, the semiconductor layer is formed by plasma CVD in the third step.

Preferably, the crystalline film is formed by high density plasma CVD in the third step.

The high density plasma CVD may be an ICP method. Alternatively, the high density plasma CVD may be a surface wave plasma method. Alternatively, the high density plasma CVD may be an ECR method.

Preferably, a film formation pressure is 0.133 Pa to 13.3 Pa in the plasma CVD.

Preferably, in the plasma CVD, $SiH_4$ and $H_2$ are used as a material gas and a flow rate ratio of $SiH_4$ to $H_2$, that is, $SiH_4/H_2$, is 1/30 to 1/1.

Only $SiH_4$ may be used as a material gas in the plasma CVD.

Preferably, the first amorphous film is subjected to surface treatment with $H_2$ plasma before the crystalline film is formed.

-Functions-

In a semiconductor device of the present invention, a semiconductor layer having a channel region has a crystalline film. The carrier mobility in the channel region is therefore improved. In other words, an on-state current can be increased. Moreover, the semiconductor layer has a first amorphous film, and the first amorphous film is formed directly on a gate insulating film. An excellent interface can therefore be formed between the semiconductor layer and the gate insulating film. As a result, a fixed charge density and an interface state density are reduced, whereby an extreme negative shift of the threshold voltage is suppressed and an S value indicating rising characteristics of an on-state current are improved. Moreover, since a manufacturing process can be stably performed, the threshold voltage can be easily controlled. Moreover, since the first amorphous film having a relatively high electric resistance is formed directly on the gate insulating film, a leakage current from the semiconductor layer to the gate insulating film is reduced and an off-state current is reduced.

Especially when a second amorphous film is formed between the crystalline film and an impurity layer, a leakage current is reduced also between the semiconductor layer and the impurity layer due to a relatively high electric resistance of the second amorphous film, and an off-state current is reduced. A display device having the above semiconductor device thus has an improved display quality and improved reliability.

The semiconductor device is preferably formed with, for example, a bottom gate structure. The semiconductor layer is preferably made of, for example, silicon. The crystalline film is preferably made of microcrystalline silicon. The semiconductor device can thus be manufactured by the same manufacturing process as a typical a-Si TFT manufacturing process.

Especially when a columnar crystal has a diameter of 10 nm to 40 nm in cross section, uniform characteristics of an element can be obtained because the diameter is sufficiently smaller than the size of the element. The first amorphous film is preferably made of, for example, amorphous silicon. The gate insulating film is preferably made of, for example, a silicon nitride film.

If the first amorphous film is thinner than 5 nm, excellent interface characteristics cannot be obtained. If the first amorphous film is thicker than 30 nm, on the other hand, it is difficult to cause only the crystalline film to function as a channel region. Accordingly, excellent on-state characteristics cannot be obtained. In other words, the first amorphous film preferably has a thickness of, for example, 5 nm to 30 nm in order to improve the on-state characteristics and the interface characteristics.

The impurity layer may have, for example, a layered structure of a amorphous first layer and a second layer including a crystal phase, or a layered structure of a low impurity layer and a high impurity layer. This alleviates an electrode field near the source region and the drain region, whereby an off-state current is reduced.

In the case of manufacturing the semiconductor device, first to fourth steps are performed. In the first step, a gate electrode is formed on an insulating substrate. In the second step, a gate insulating film is then formed so as to cover the gate electrode. In the third step, a semiconductor layer and a semiconductor layer containing impurities are formed. A step of forming a first amorphous film so as to cover the gate insulating film and a step of forming a crystalline film including a crystal phase so as to cover the first amorphous layer are performed in the third step. The semiconductor layer is then etched to form an active layer. The semiconductor device can thus be manufactured by using a typical a-Si TFT process such as a channel etch process.

In the fourth step, the semiconductor layer is then etched to form an active layer. In a fifth step, the impurity layer is etched to form a source region and a drain region. The semiconductor device is thus manufactured.

Especially, a step of forming a second amorphous film so as to cover the crystalline film may be performed in the third step. In this case, an impurity layer can be formed on the second amorphous layer having a relatively high electric resistance. As a result, an off-state current is reduced also between the semiconductor layer and the impurity layer.

In the third step, an etch stopper portion may be formed on the semiconductor layer, and the impurity layer may be formed so as to cover the semiconductor layer and the etch stopper portion. In this case, only the impurity layer can be etched while protecting the semiconductor layer by the etch stopper portion. As a result, on-state characteristics and reliability of an element are improved. Moreover, the semiconductor device can be manufactured by using a typical a-Si TFT process such as an etch stopper process.

The crystalline film may be formed by plasma CVD (high density plasma CVD is especially preferred). In this case, the crystalline film can be formed at a low temperature. Accordingly, a glass substrate, a plastic substrate, and the like which are not suitable for high temperature processing can be used as the insulating substrate. Moreover, productivity can be improved. The use of plasma CVD also improves the crystallization ratio of a crystalline film such as a microcrystalline silicon film, and significantly improves the crystallization ratio of a crystalline film especially in the early stage of the film formation. In other words, by using plasma CVD, a crystalline film having a high crystallization ratio and a high density can be formed from the early stage of film formation.

The crystalline film can be formed even when the flow rate ratio of $SiH_4$ to $H_2$, that is, $SiH_4/H_2$, is 1/30 to 1/1. Only $SiH_4$ may be used as a material gas in the plasma CVD. In this case as well, an excellent crystalline silicon film is formed. Since a denser film is formed, the resistance to a chemical is improved and the amount of hydrogen in the film is reduced, whereby reliability is improved.

Before the crystalline film is formed, the first amorphous film may be subjected to surface treatment by $H_2$ plasma. This further improves the crystalline property from the early stage of film formation.

Effects of the Invention

According to the present invention, a semiconductor layer having a channel region has a layered structure of a first amorphous film formed directly on a gate insulating film and a crystalline film. An excellent interface can therefore be formed between the first amorphous film of the semiconductor layer including the channel region and the gate insulating film, and the carrier mobility in the channel region can be improved. Such an excellent interface can suppress an extreme negative shift of the threshold voltage, whereby rising characteristics of an on-state current can be improved, and on-state characteristics can be improved.

DESCRIPTION OF THE REFERENCE NUMERALS

1 TFT
2 channel region
3 semiconductor layer
4 source region
5 drain region
6 active layer
11 glass substrate (insulating substrate)
12 gate electrode
13 gate insulating film
14 first a-Si film (first amorphous film)
15 microcrystalline Si film (crystalline film)
16 second a-Si film (second amorphous film)
17 n+ silicon layer (impurity layer)
18 electrode layer
19 source electrode
20 drain electrode
30 etch stopper portion
31 silicon nitride film
33 first layer
34 second layer
35 low impurity region
36 high impurity region
42 active matrix substrate (semiconductor device)

DETAILED DESCRIPTION OF THE INVENTION

Hereinafter, embodiments of the present invention will be described in detail with reference to the accompanying drawings. Note that the present invention is not limited to the following embodiments.

(First Embodiment)

Figure 1:
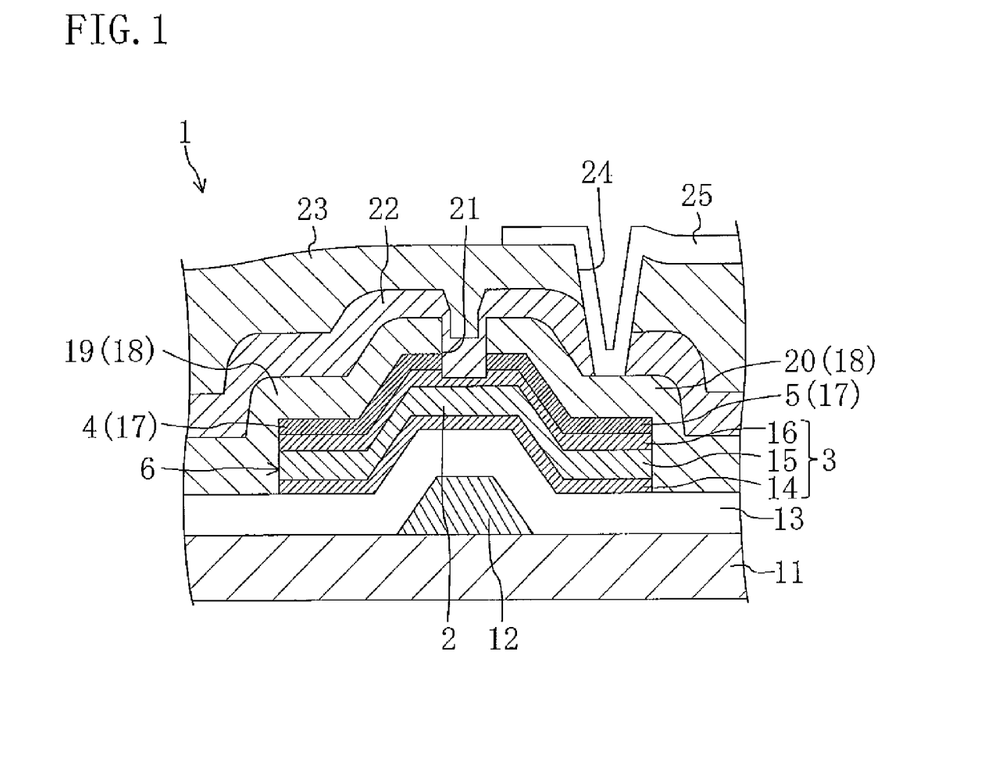
FIG. 1 is an enlarged cross-sectional view showing a structure of a TFT 1 according to a first embodiment.
Figure 5:
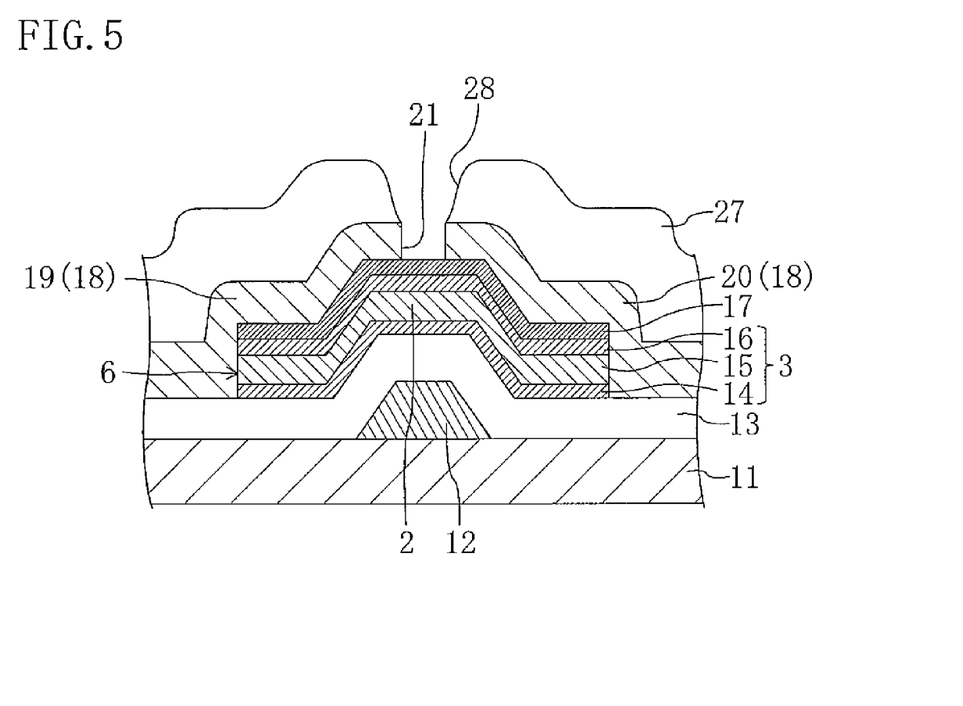
FIG. 5 is a cross-sectional view showing a state in which a photoresist, a source electrode, and a drain electrode are formed.
Figure 6:
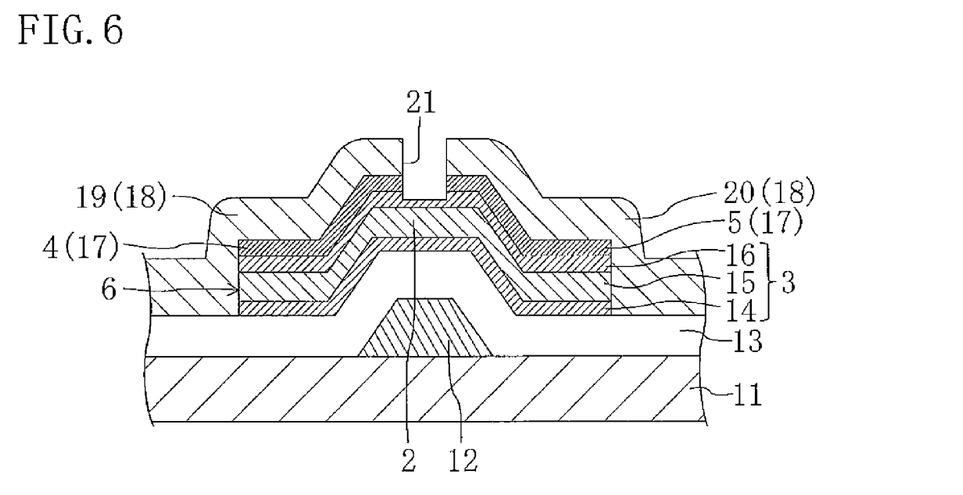
FIG. 6 is a cross-sectional view showing a state in which a source region and a drain region are formed.
Figure 7:
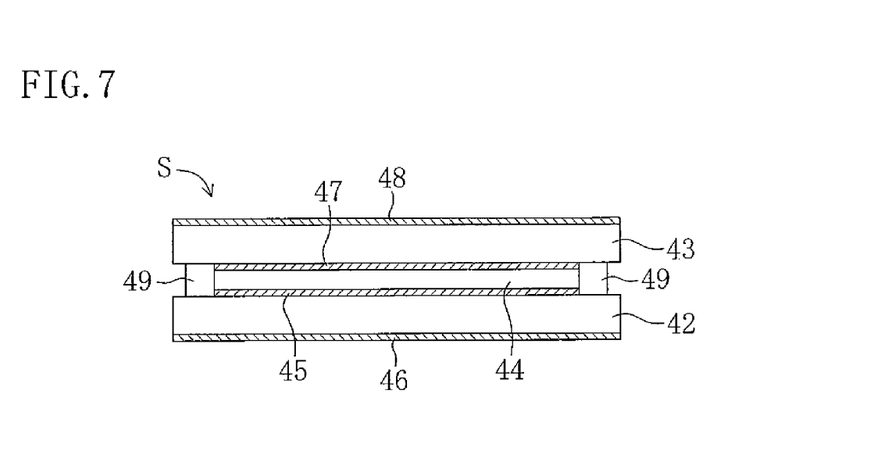
FIG. 7 is a cross-sectional view showing a schematic structure of a liquid crystal display device.

FIGS. 1 through 12 show a first embodiment of the present invention. FIG. 7 is a cross-sectional view schematically showing a main part of a liquid crystal display device S. FIG. 1 is an enlarged cross-sectional view of a TFT 1. FIGS. 2 through 6 are enlarged cross-sectional views illustrating a manufacturing method of the TFT 1.

As shown in FIG. 7, the liquid crystal display device S includes an active matrix substrate 42 as a first substrate which is a semiconductor device, and a counter substrate 43 as a second substrate which is provided so as to face the active matrix substrate 42 with a liquid crystal layer 44 as a display medium layer interposed therebetween.

A plurality of pixels (not shown) are provided in the active matrix substrate 42. A TFT (thin film transistor) 1, which is a switching element as shown in FIG. 1, is formed at each pixel. The active matrix substrate 42 has an alignment film 45 on a surface of the liquid crystal layer 44 side, and a polarizing plate 46 on a surface of the opposite side to the liquid crystal layer 44. A driver IC (not shown) for controlling each TFT 1 is mounted on the active matrix substrate 42. In the active matrix substrate 42 as a semiconductor device, a plurality of NMOS transistors are thus formed as the TFTs 1 on the same semiconductor substrate.

Although not shown in the figure, a color filter, an ITO common electrode, and the like are formed on the counter substrate 43. The counter substrate 43 has an alignment film 47 on a surface of the liquid crystal layer 44 side, and a polarizing plate 48 on a surface of the opposite side to the liquid crystal layer 44. The liquid crystal layer 44 is sealed by a seal member 49 provided between the active matrix substrate 42 and the counter substrate 43. The liquid crystal display device S provides desired display by controlling an orientation state of liquid crystal molecules in the liquid crystal layer 44 on a pixel by pixel basis by the TFTs 1.

The TFTs 1 will now be described in detail. Note that description will be herein given to one NMOS transistor.

As shown in FIG. 1, the TFT 1 includes a semiconductor layer 3 having a channel region 2, an impurity layer 17 having a source region 4 and a drain region 5, and a gate electrode 12 provided so as to face the semiconductor layer 3 with a gate insulating film 13 interposed therebetween.

In other words, the gate electrode 12 is formed in a convex shape on the surface of the glass substrate 11 as an insulating substrate, and a gate insulating film 13 is formed so as to cover the gate electrode 12. The gate insulating film 13 is made oft for example, a silicon nitride film. The gate insulating film 13 has a convex surface along the surface of the gate electrode 12. A semiconductor layer 3 is formed so as to cover the convex portion of the gate electrode 12. An impurity layer 17 containing impurities such as phosphorus is formed on the semiconductor layer 3. The semiconductor layer 3 and the impurity layer 17 are formed along the surface of the gate insulating film 13.

The semiconductor layer 3 is made of silicon and has a layered structure of at least a first amorphous film 14 and a crystalline film 15 including a crystal phase. At least one layer of a second amorphous film 16 is formed between the crystalline film 15 and the impurity layer 17. In other words, the semiconductor layer 3 is formed by a first a-Si film 14 as the first amorphous film, a microcrystalline Si film 15 as the crystalline film, and a second a-Si film 16 as the second amorphous film. Note that a plurality of amorphous films may be formed between the microcrystalline Si film 15 and the impurity layer 17.

The first a-Si film 14 is made of amorphous silicon as an amorphous semiconductor and is formed directly on a surface of the gate insulating film 13. The first a-Si film 14 is formed with a thickness of 5 nm to 30 nm.

The microcrystalline Si film 15 is made of microcrystalline silicon of a columnar crystal extending perpendicularly to the surface of the microcrystalline Si film 15. The columnar crystal has a diameter of 10 nm to 40 nm in cross section.

Like the first a-Si film 14, the second a-Si film 16 is made of amorphous silicon and is formed on a surface of the microcrystalline Si film 15. The impurity layer 17 is an n+ silicon layer 17 which is a semiconductor layer doped with n-type impurities. The n+ silicon layer 17 is divided into the source region 4 and the drain region 5 by an opening 21 described later at a position above the gate electrode 12. The source region 4 and the drain region 5 of the n+ silicon layer 17 are thus formed directly on a surface of the second a-Si film 16. The channel region 2 is formed in the microcrystalline Si film 15 between the source region 4 and the drain region 5.

An electrode layer 18 made of a metal material is formed on the n+ silicon layer 17. The electrode layer 18 is formed so as to cover the n+ silicon layer 17 and the gate insulating film 13. The opening 21 is formed in the electrode layer 18, the n+ silicon layer 17, and the second a-Si film 16 at a position above the gate electrode 12 so as to extend through the electrode layer 18 and the n+ silicon layer 17. In other words, the second a-Si film 16 has a recess in its upper surface so that the recess forms the bottom of the opening 21.

The electrode layer 18 is divided into a source electrode 19 and a drain electrode 20 by the opening 21. The source electrode 19 is formed on the source region 4, while the drain electrode 20 is formed on the drain region 5.

The electrode layer 18 (the source electrode 19 and the drain electrode 20) is covered by a passivation film 22. The passivation film 22 is made of, for example, a silicon nitride film and covers also the inside of the opening 21. The passivation film 22 is covered by a planarizing film 23 made of a transparent resin film.

A contact hole 24 is formed in the planarizing film 23 and the passivation film 22 so as to extend through the planarizing film 23 and the passivation film 22. The contact hole 24 reaches the surface of the drain region 5. A transparent electrode 25 connected to the drain region 5 through the contact hole 24 is formed on a surface of the planarizing film 23. The transparent electrode 25 is made of, for example, ITO.

As described above, the TFT 1 has a bottom gate structure in which the semiconductor layer 3 is formed over the glass substrate so as to cover the gate electrode 12 and at least a part of the gate insulating film 13.

-Manufacturing Method-

A manufacturing method of the active matrix substrate 42 as a semiconductor device will now be described. The active matrix substrate 42 is manufactured by forming the TFTs 1, not-shown interconnects, and the like over the glass substrate 11, forming the alignment film 45, and then bonding the polarizing plate 46 and mounting a driver IC (not shown) and the like.

The manufacturing method of the active matrix substrate 42 of the present embodiment is characterized by a manufacturing process of the TFTs 1. Therefore, the manufacturing process of the TFTs 1 will be described in detail with reference to FIGS. 1 through 6.

Figure 2:
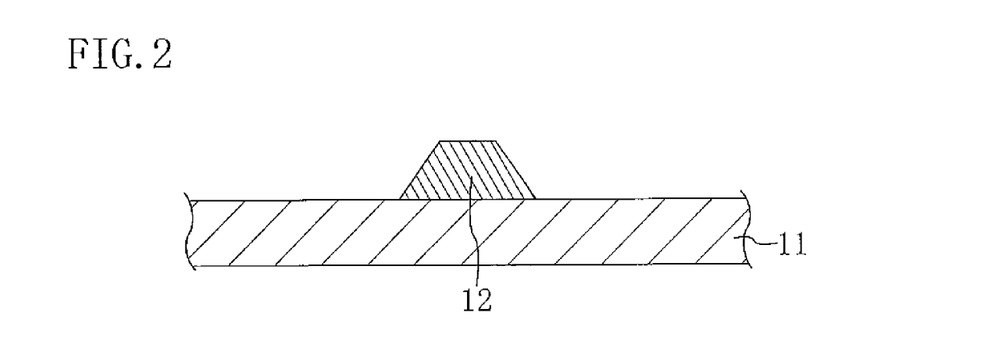
FIG. 2 is a cross-sectional view showing a gate electrode formed on a glass substrate.

First, as shown in FIG. 2, a gate electrode 12 is formed on a glass substrate 11 in a first step. In other words, a TaN film, a Ta film, and a TaN film are sequentially formed in this order on a surface of the glass substrate 11 by a sputtering method, and then patterned by etching to form the gate electrode 12. This etching is performed by using a dry etching method. By introducing oxygen into an etching gas, this etching is performed while decreasing the photoresist. The gate electrode 12 thus has a tapered shape in cross section having an angle of 45° with respect to the surface of the glass substrate 11.

Figure 3:
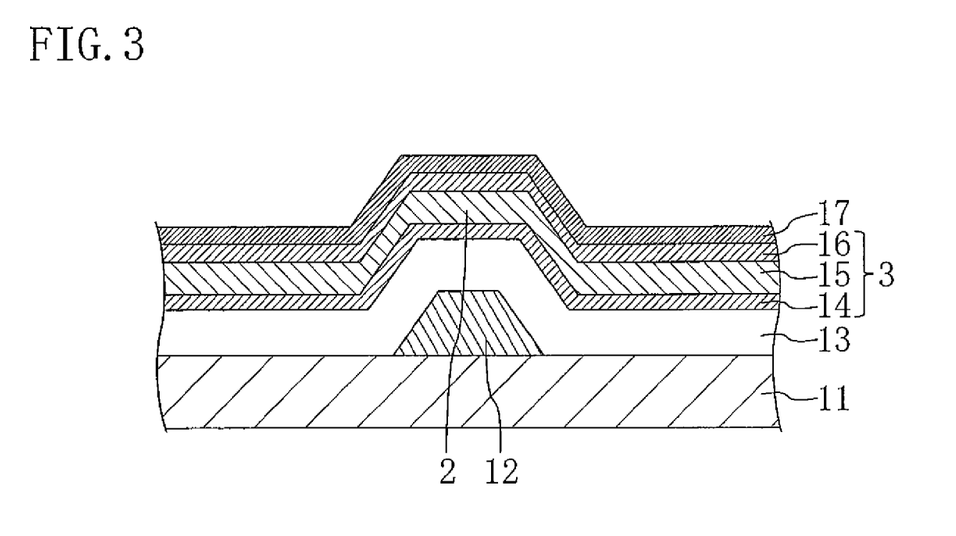
FIG. 3 is a cross-sectional view showing a state in which a gate insulating film, a semiconductor layer, and an impurity layer are further formed.

In a second step, as shown in FIG. 3, a gate insulating film 13 is formed so as to cover the gate electrode 12. The gate insulating film 13 is formed by depositing a silicon nitride film (SiNx film) with a thickness of about 400 nm by plasma CVD.

As shown in FIG. 3, a semiconductor layer 3 and an impurity layer (n+ silicon layer) 17 are then formed in a third step. The semiconductor layer 3 is formed by plasma CVD. The third step includes a step of forming a first a-Si film 14 so as to cover the gate insulating film 13 and a step of forming a microcrystalline Si film 15 so as to cover the first a-Si film 14. The third step further includes a step of forming a second a-Si film 16 so as to cover the microcrystalline Si film 15.

The silicon nitride film of the gate insulating film 13, the first a-Si film 14, and the second a-Si film 16 are formed by a parallel flat plate type plasma CVD apparatus. The microcrystalline Si film 15, on the other hand, is formed by high density plasma CVD (an ICP method, a surface wave plasma method, or an ECR method). These films 14, 15, and 16 are continuously deposited in vacuum by a multi-chamber apparatus.

The gate insulating film 13, the first a-Si film 14, the second a-Si film 16, and the n+ silicon layer 17 can be formed under the same film formation conditions as those of a typical a-Si TFT manufacturing process. The microcrystalline Si film 15, on the other hand, is formed at a film formation pressure of 0.133 Pa to 13.3 Pa. For example, the film formation pressure is preferably about 1.33 Pa (10 mTorr). $SiH_4$ and $H_2$ are used as a material gas of the plasma CVD, and the flow rate ratio of $SiH_4$ to $H_2$, that is, $SiH_4/H_2$, is 1/30 to 1/1. For example, $SiH_4/H_2$ is preferably about 1/20. The temperature of the glass substrate 11 is about 300°. Ar may be simultaneously introduced as a carrier gas used in the plasma CVD method, which stabilizes plasma. Before the microcrystalline Si film 15 is formed, the first a-Si film 14 is subjected to surface treatment by $H_2$ plasma. At this time, a film formation pressure is about 1.33 Pa.

The first a-Si film 14 has a thickness of about 10 nm, the microcrystalline Si film 15 has a thickness of about 30 nm, and the second a-Si film 16 has a thickness of 100 nm. The n+ silicon film 17 has a thickness of 60 nm. The n+ silicon film 17 may either be microcrystalline silicon or amorphous silicon.

Note that only $SiH_4$ may be used as a material gas in the plasma CVD. In this case as well, an excellent crystalline silicon film is formed. Since a denser film is formed, the resistance to a chemical can be improved and the amount of hydrogen in the film can be reduced, whereby reliability is improved.

Figure 4:
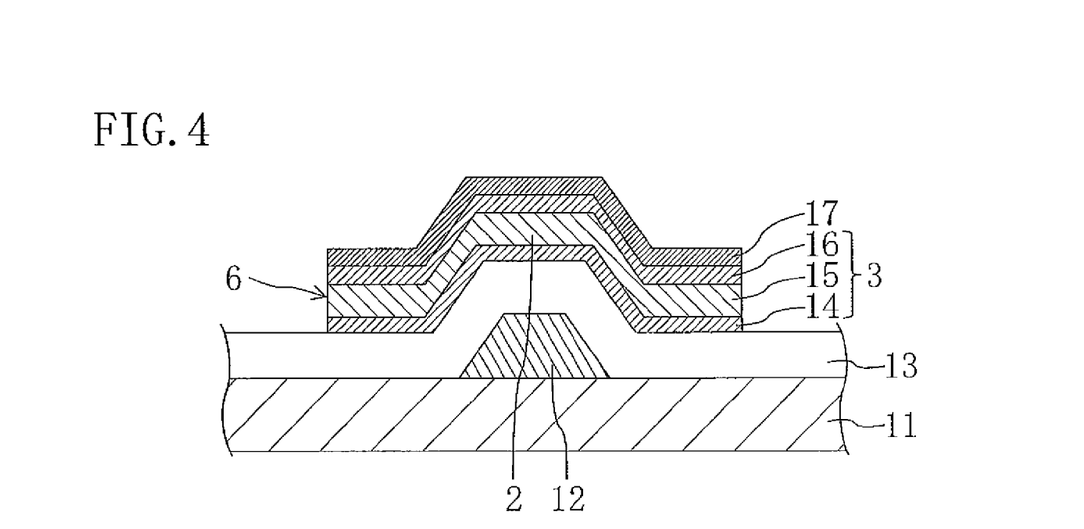
FIG. 4 is a cross-sectional view showing a state in which an active region is patterned.

In a fourth step, as shown in FIG. 4, the semiconductor layer 3 is etched to form an active layer 6. In other words, the semiconductor layer 3 (the first a-Si film 14, the microcrystalline Si film 15, and the second a-Si film 16) and the n+ silicon film 17 are patterned by photolithography to form an active layer 6 in an island shape. The etching is performed by using a dry etching method. The use of the dry etching method enables formation of even a fine pattern. Chlorine ($Cl_2$) that easily provides a desired selectivity to the silicon nitride film of the gate insulating film 13 is used as an etching gas. During the etching, a portion that is being etched is monitored by an end point detector (EPD), and the etching is performed until the gate insulating film 13 is exposed.

Thereafter, a source electrode 19 and a drain electrode 20 are formed as shown in FIG. 5. First, an Al/Mo film is formed as an electrode layer 18 by sputtering. The electrode layer 18 has a thickness of Al=100 nm and Mo=100 nm. A photoresist 27 is then formed so as to cover the electrode layer 18. An opening 28 is formed in the photoresist 27 so as to expose the electrode layer 18 at a position above the gate electrode 12. By using the photoresist 27 as a mask, the electrode layer 18 is etched to form an opening 21 in the electrode layer 18, whereby the source electrode 19 and the drain electrode 20 are formed on both sides of the opening 21. Only the electrode layer 18 can be selectively etched away by using a wet etching method. An SLA etchant is used in this etching.

In a fifth step, as shown in FIG. 6, the n+ silicon layer 17 is etched to form a source region 4 and a drain region 5. In other words, with the photoresist 27 being left as it is, dry etching is performed to etch away the n+ silicon layer 17 exposed from the photoresist 27. The opening 21 thus extends through the electrode layer 18 and the n+ silicon layer 17 to the second a-Si film 16. More specifically, not only the n+ silicon layer 17 but also a part of the second a-Si film 16 are etched. Separation into the source region 4 and the drain region 5 can thus be performed by using the photoresist 27 used to form the source electrode 19 and the drain electrode 20 (a channel etch process).

A transparent electrode 25 is then formed as shown in FIG. 1. First, a silicon nitride film is formed by a plasma CVD method so as to cover the source electrode 19 and the drain electrode 20. The silicon nitride film serves as a passivation film 22. At this time, the passivation film 22 is formed also in the opening 21. The source region 4 and the drain region 5 are thus isolated from each other by the passivation film 22.

A resin film (JAS film) is then formed so as to cover the passivation film 22. The resin film thus formed serves as a planarizing film 23. A contact hole 24 extending through the planarizing film 23 and the passivation film 22 is formed at a position above the drain electrode 20. An ITO film is then formed by sputtering in the contact hole 24 and on the surface of the planarizing film 23. The ITO film thus formed is then patterned to form a transparent electrode 25. A plurality of TFTs 1 are thus manufactured on the active matrix substrate 42 of a liquid crystal display device by the above steps.

-Effects of the First Embodiment-

The microcrystalline Si film 15 has a mixed structure of crystalline Si and amorphous Si. This structure can be measured by Raman spectroscopy. Crystalline Si has a sharp peak at a wavelength of 520 $cm^{-1}$, while amorphous Si has a broad peak at a wavelength of 480 $cm^{-1}$. Since the microcrystalline Si film 15 is a mixture of crystalline Si and amorphous Si, the microcrystalline Si film 15 has a spectrum having a highest peak at a wavelength of 520 $cm^{-1}$ and a broad peak on a low wavelength side. The crystallization rate can be compared by the peak intensity ratio of 520 $cm^{-1}$ to 480 $cm^{-1}$. By high density plasma CVD, the peak intensity ratio (520 $cm^{-1}$/480 $cm^{-1}$) is about 2 to 8. The use of high density plasma CVD can increase the ratio of crystalline Si, but cannot form a film entirely made of crystalline Si, whereby a mixture of crystalline Si and amorphous Si is formed.

Moreover, polycrystalline Si formed by solid-phase crystallization (SPC) or laser crystallization has the peak intensity ratio of about 15 to 80, and the film contains virtually no amorphous component. Such a crystalline Si film has an excellent interface with a silicon oxide film. However, since the microcrystalline Si film 15 is a mixture of crystalline Si and amorphous Si, the microcrystalline Si film 15 has an excellent interface neither with a silicon oxide film nor a silicon nitride film. Since the ratio of crystalline Si is low especially in the early stage of film formation (especially when the peak intensity ratio is 2 or less), such a defective interface is a critical problem in the bottom gate structure.

In the first embodiment, on the other hand, the semiconductor layer 3 having the channel region 2 is formed by forming the first a-Si film 14 formed directly on the gate insulating film 13 and the microcrystalline Si film 15. Therefore, an excellent interface can be formed between the first a-Si film 14 of the semiconductor layer 3 and the gate insulating film 13, and the carrier mobility in the channel region 2 can be improved by the microcrystalline Si film 15. As a result, the fixed charge density and the interface state density are reduced, whereby an extreme negative shift of the threshold voltage can be suppressed and the S value indicating rising characteristics of an on-state current can be improved. Moreover, since the manufacturing process can be performed stably, it is easy to control the threshold voltage. Moreover, since the first a-Si film 14 having a relatively high electric resistance is formed directly on the gate insulating film 13, a leakage current from the semiconductor layer 3 to the gate insulating film 13 is reduced, whereby an off-state current is reduced.

Moreover, the second a-Si film 16 is formed between the microcrystalline Si film 15 and the n+ silicon layer 17. Since the second a-Si film 16 has a relatively high electric resistance, a leakage current between the semiconductor layer 3 and the n+ silicon layer 17 is reduced, whereby an off-state current is reduced.

Moreover, since the microcrystalline Si film 15 is used as the crystalline film 15, the crystalline film 15 can be easily manufactured by the same manufacturing process as a typical a-Si TFT manufacturing process. Moreover, the columnar crystal of the microcrystalline Si film 15 has a diameter of 10 nm to 40 nm in cross section. Since the crystal cross section is sufficiently smaller than the element size. Therefore, uniform element characteristics can be obtained.

If the first a-Si film 14 is thinner than 5 nm, excellent interface characteristics cannot be obtained. If the first a-Si film 14 is thicker than 30 nm, on the other hand, it is difficult to make only the microcrystalline Si film 15 function as the channel region 2. Accordingly, excellent on-state characteristics cannot be obtained. In the present embodiment, the first a-Si film 14 is formed with a thickness of, for example, 5 nm to 30 nm, both the on-state characteristics and the interface characteristics can be improved.

According to the manufacturing method of the present embodiment, the TFTs 1 and the active matrix substrate 42 can be easily manufactured by using a channel etch process that is a typical a-Si TFT process.

Moreover, since plasma CVD (high density plasma CVD is especially preferable) is used to form the microcrystalline Si film 15, the microcrystalline Si film 15 can be formed at a low temperature. Accordingly, a glass substrate, a plastic substrate, and the like, i.e., the substrates which are used in a display device but are not suitable for high temperature processing, can be used as the insulating substrate 11. Moreover, productivity can be improved. The use of high density plasma CVD can also improve the crystallization ratio of the microcrystalline Si film 15, and can significantly improve the crystallization ratio of the microcrystalline Si film 15 especially in the early stage of the film formation. In other words, by using high density plasma CVD, the microcrystalline Si film 15 having a high crystallization ratio and a high density can be formed from the early stage of film formation.

In a commonly used so-called parallel flat plate type plasma CVD apparatus, it is difficult to obtain a crystalline property from the early stage of film formation, and a portion of a thickness of about 50 nm formed in the early stage becomes an incubation layer.

Note that the incubation layer is a precursor before the microcrystalline Si film grows, and is different in structure from the first amorphous film (first a-Si film) 14 that is used at the interface with the gate insulating film 13 in the present invention. Since the incubation layer contains a large amount of voids, an excellent interface with the gate insulating film cannot be obtained and the mobility is extremely low. The difference between the incubation layer and the first amorphous film 14 can be easily determined by a FT-IR method. If a film contains a large amount of FT-IR voids, a peak of the spectrum of Si—$H_2$, (Si—$H_2$)$_n$ is observed at a wavelength of around 2,100 $cm^{-1}$. If a film contains a small amount of voids, on the other hand, a peak of the Si—H spectrum is observed at a wavelength of around 2,000 $cm^{-1}$. In other words, the spectrum of the incubation layer has an absorption peak at wavelengths of 2,000 $cm^{-1}$ and 2,100 $cm^{-1}$ and the ratio of the absorption peak around 2,100 $cm^{-1}$ is 75% or more. The spectrum of the first amorphous film (first a-Si film) 14 used in the present invention has an absorption peak at wavelengths of 2,000 $cm^{-1}$ and 2,100 $cm^{-1}$ and the ratio of the absorption peak around 2,000 $cm^{-1}$ is 75% or more.

In order to form a microcrystalline Si film by the parallel flat plate type plasma CVD apparatus, the ratio $SiH_4/H_2$ needs to be in the range of about 1/300 to 1/100. In this case, the $SiH_4$ supply rate becomes extremely low, resulting in a significantly low film formation rate.

In the present embodiment, on the other hand, the microcrystalline Si film 15 can be formed even when the flow rate ratio of $SiH_4$ to $H_2$, that is, $SiH_4/H_2$, is in the range of 1/30 to 1/1. Moreover, before the microcrystalline Si film 15 is formed, the first a-Si film 14 is subjected to surface treatment by $H_2$ plasma. This further improves the crystalline property from the early stage of film formation.

The liquid crystal display device S having the TFTs 1 and the active matrix substrate 42 thus has an improved display quality and improved reliability.

(Second Embodiment)

Figure 8:
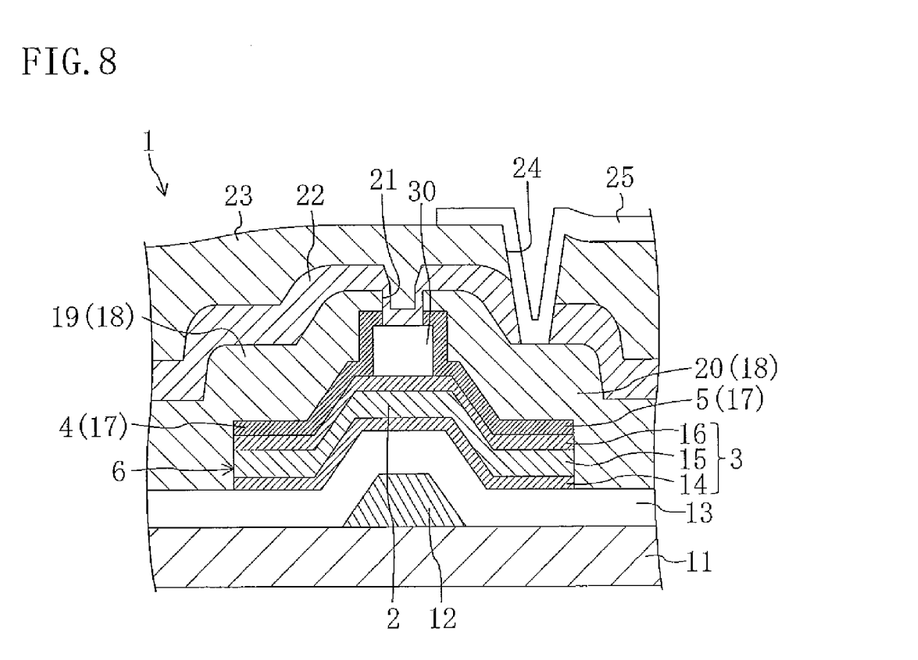
FIG. 8 is an enlarged cross-sectional view showing a structure of a TFT 1 according to a second embodiment.

FIGS. 8 through 12 show a second embodiment of the present invention. FIG. 8 is an enlarged cross-sectional view of a TFT 1. FIGS. 9 through 12 are enlarged cross-sectional views illustrating a manufacturing method of the TFT 1. Note that, in the following embodiments, the same parts as those of FIGS. 1 through 7 are denoted by the same reference numerals, and detailed description thereof will be omitted.

The second embodiment is different from the first embodiment in that an etch stopper portion 30 is formed. More specifically, as shown in FIG. 8, the etch stopper portion 30 is formed on a semiconductor layer 3 at a position above a gate electrode 12. The etch stopper portion 30 is formed on a surface of a second a-Si film 16 and has its side surface and a part of its top surface covered by a source region 4 or a drain region 5. An opening 21 is formed on the etch stopper portion 30 so as to extend through an electrode layer 18 and an n+ silicon layer 17. Like the first embodiment, a passivation film 22 is formed in the opening 21.

In the first embodiment, a part of the second a-Si film 16 is removed to form the bottom of the opening 21. In the second embodiment, however, the second a-Si film 16 is protected by the etch stopper portion 30 and is not removed. The structure of the TFT 1 of the second embodiment is otherwise the same as that of the first embodiment.

-Manufacturing Method-

A manufacturing method of the second embodiment will now be described.

Figure 9:
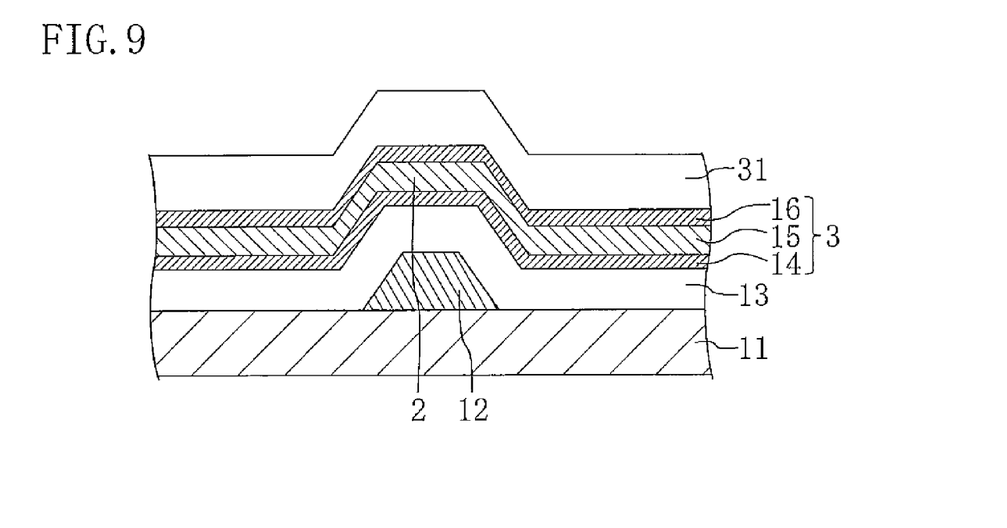
FIG. 9 is a cross-sectional view showing a state in which a gate insulating film, a semiconductor layer, an impurity layer, and a silicon nitride film are further formed.

First, like the first embodiment, a first step and a second step are performed to from a gate electrode 12 and a gate insulating film 13 on a glass substrate 11. A semiconductor layer 3 and an n+ silicon layer 17 are then formed in a third step. Specifically, in this step, an etch stopper portion 30 is formed on the semiconductor layer 3 and the n+ silicon layer 17 is formed so as to cover the semiconductor layer 3 and the etch stopper portion 30.

More specifically, as shown in FIG. 9, a first a-Si film 14 is formed so as to cover The gate insulating film 13. A microcrystalline Si film 15 is then formed so as to cover the first a-Si film 14. A second a-Si film 16 is then formed so as to cover the microcrystalline Si film 15. A silicon nitride film 31 is then formed so as to cover the second a-Si film 16. The silicon nitride film 31 is formed by a parallel flat plate type plasma CVD apparatus. The first a-Si film 14 has a thickness of about 5 nm, the microcrystalline Si film 15 has a thickness of about 20 nm, and the second a-Si film 16 has a thickness of about 25 nm. The silicon nitride film 31 has a thickness of about 150 nm.

Figure 10:
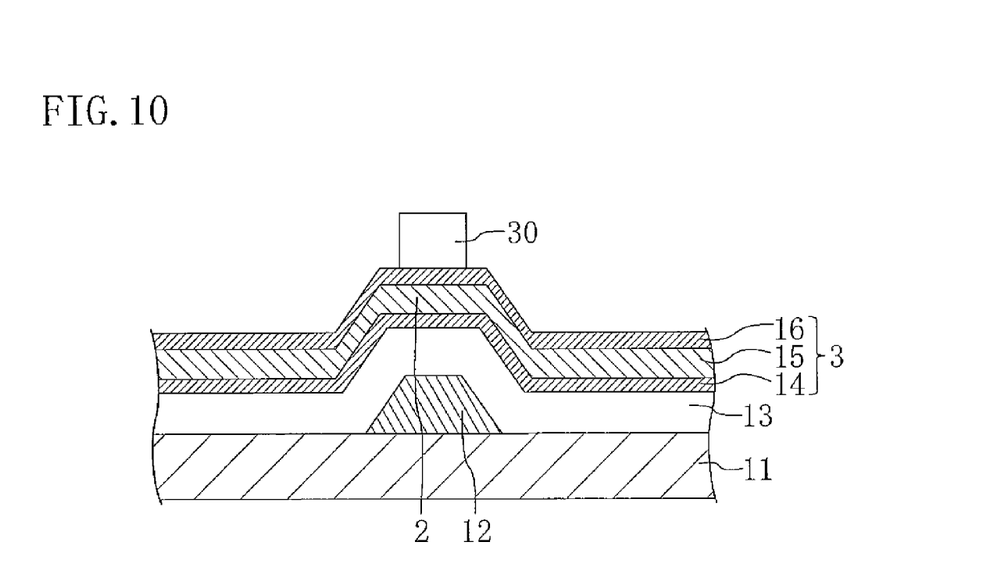
FIG. 10 is a cross-sectional view showing a state in which an etch stopper portion is patterned.
Figure 11:
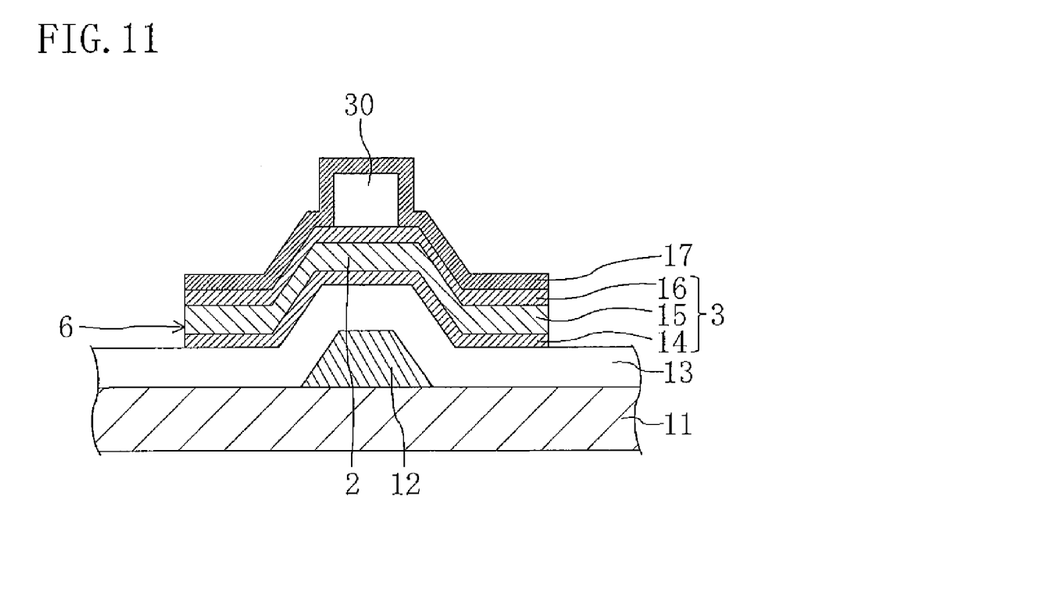
FIG. 11 is a cross-sectional view showing a state in which an active region is patterned.

The silicon nitride film 31 is then exposed to light from the back side of the glass substrate 11 (i.e., from the gate electrode 12 side) in order to pattern the silicon nitride film 31 in a self-alignment manner with the gate electrode 12 as shown in FIG. 10. An n+ silicon layer 17, which is an impurity region containing, for example, phosphorus or the like, is formed by a plasma CVD method so as to cover the second a-Si film 16 and the silicon nitride film 31. In a fourth step, as shown in FIG. 11, the semiconductor layer 3 is etched to form an active layer 6 in an island shape.

Thereafter, an electrode layer 18 is formed so as to cover the n+ silicon layer 17 and the gate insulating film 13. The electrode layer 18 is formed by depositing a Mo film on the n+ silicon layer 17 and the gate insulating film 13 by sputtering. The electrode layer 18 has a thickness of 200 nm. The electrode layer 18 is then etched through a photoresist to form an opening 21 at a position above the gate electrode 12. At this time, only the electrode layer 18 made of the Mo film can be selectively etched by using wet etching. An SLA etchant is used in the etching. The electrode layer 18 is thus divided into a source electrode 19 and a drain electrode 20.

Figure 12:
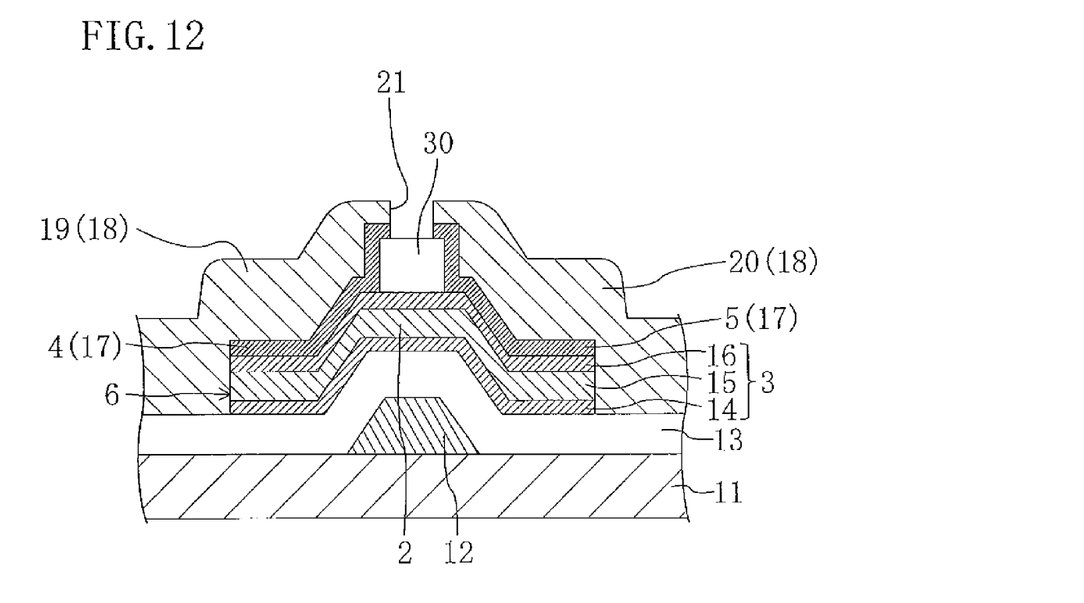
FIG. 12 is a cross-sectional view showing a state in which a source electrode, a drain electrode, a source region, and a drain region are formed.

With the photoresist being left as it is, the n+ silicon layer 17 is then subjected to dry etching. As shown in FIG. 12, the n+ silicon layer 17 is thus divided into a source region 4 and a drain region 5. Since the etch stopper portion 30 is present between the n+ silicon layer 17 and the second a-Si film 16, the channel region 2 is not damaged by the etching, whereby improvement in both on-state characteristics and reliability can be expected.

A passivation film 22, a planarizing film 23, and a transparent electrode 25 are then formed in the same manner as that of the first embodiment. The TFT 1 is thus manufactured.

-Effects of the Second Embodiment-

According to the second embodiment, only the n+ silicon layer 17 can be selectively etched while protecting the semiconductor layer 3 by the etch stopper portion 30. Accordingly, the thickness of the semiconductor layer 3 can be reduced as compared to the case of using a channel etch process. As a result, an off-state current can further be reduced, whereby on-state characteristics and reliability can be improved.

Moreover, the TFT 1 and the active matrix substrate 42 can be easily manufactured by using an etch stopper process that is a typical a-Si TFT process.

(Other Embodiments)

According to the present invention, the first embodiment may have the following structure.

Figure 13:
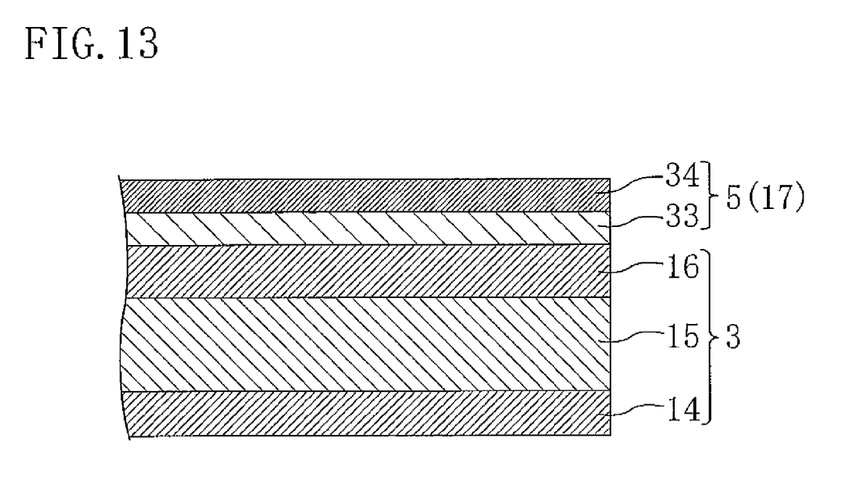
FIG. 13 is a partial enlarged cross-sectional view of an active region of another embodiment.

In the first and second embodiments, the impurity layer 17 is made of a single n+ silicon layer 17. However, the present invention is not limited to this, and the impurity layer 17 may be made of a plurality of n+ silicon layers. For example, as shown in FIG. 13, the impurity layer 17 may have a layered structure of at least an amorphous first layer 33 and a second layer 34 including a crystal phase, that is, a layered structure of at least a high resistance amorphous n+ silicon 33 and a low resistance microcrystalline n+ silicon 34. In this case, the amorphous n+ silicon 33 is formed with a thickness of 20 nm on a surface of the second a-Si film 16, and the microcrystalline n+ silicon 34 is formed with a thickness of 40 nm on a surface of the amorphous n+ silicon 33. This structure alleviates an electric field in the impurity layer 17 such as the drain region 5, whereby an off-state current is reduced as well as an on-state current is increased. This effect can be obtained by using an amorphous n+ silicon having a sheet resistance of about $5 \times 10^7 \Omega$ to $5 \times 10^8$ $\Omega/cm^2$ and a microcrystalline n+ silicon having a sheet resistance of about $5 \times 10^4 \Omega$ to $1 \times 10^6$ $\Omega/cm^2$.

Figure 14:
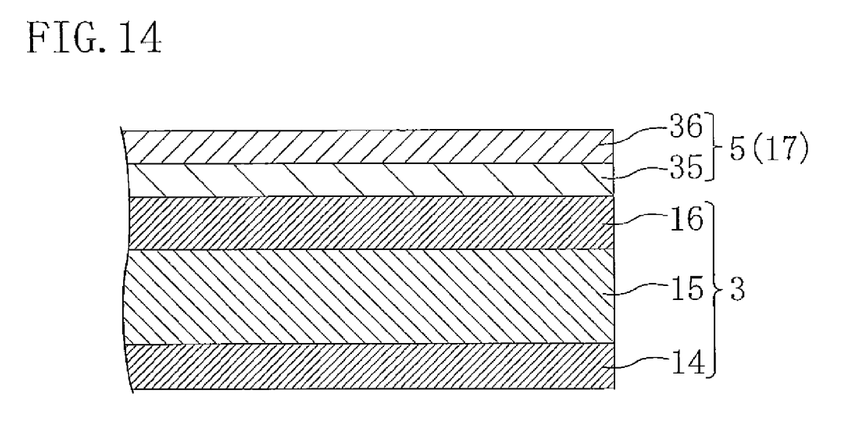
FIG. 14 is a partial enlarged cross-sectional view of an active region of still another embodiment.

Alternatively, as shown in FIG. 14, the impurity layer 17 may have a layered structure of at least a low impurity layer 35 having a relatively low impurity concentration and a high impurity region 36 having a relatively high impurity concentration. This structure alleviates an electric field near the source region 4 and the drain region 5, whereby an off-state current can be reduced.

In the first and second embodiments, description is given to a semiconductor device having a bottom gate structure. However, the present invention is not limited to this, and the present invention is similarly applicable to a semiconductor device having a top gate structure as shown in FIGS. 15 and 16.

Figure 15:
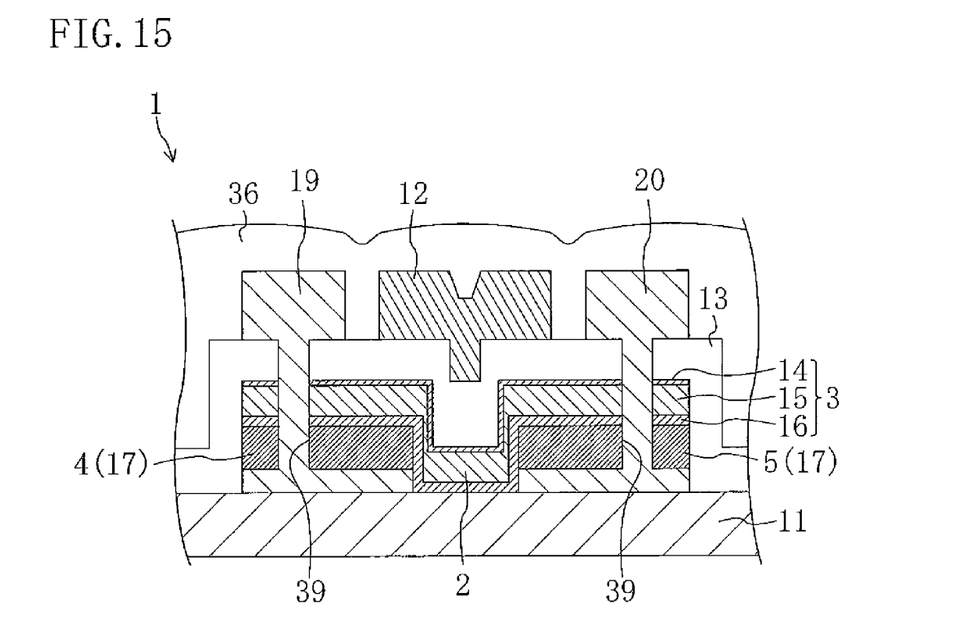
FIG. 15 is an enlarged cross-sectional view showing a structure of a staggered structure TFT.
Figure 16:
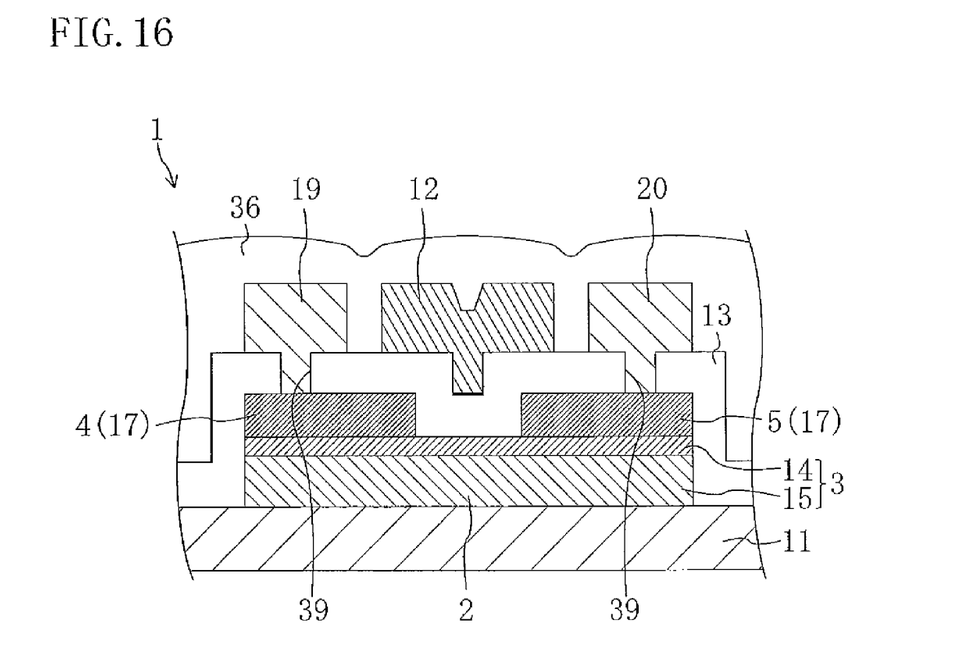
FIG. 16 is an enlarged cross-sectional view showing a structure of a channel etch coplanar type TFT.

FIG. 15 is a cross-sectional view showing a TFT 1 having a staggered structure. This TFT 1 is formed by sequentially forming a source electrode 19 and an n+ silicon layer 17 as a source region 4 in this order on a glass substrate 11 and sequentially forming a drain electrode 20 and an n+ silicon layer 17 as a drain region 5 in this order on the glass substrate 11 at a predetermined distance from the source electrode 19 and the n+ silicon layer 17. A semiconductor layer 3 is formed on the source region 4 and the drain region 5 and between the source region 4 and the drain region 5. A channel region 2 is thus formed between the source region 4 and the drain region 5.

The semiconductor layer 3 is formed by sequentially forming a second a-Si film 16, a microcrystalline Si film 15, and a first a-Si film 14 in this order. A gate insulating film 13 is formed so as to cover the semiconductor layer 3. In other words, the first a-Si film 14 forms an interface of the semiconductor layer 3 with the gate insulating film 13.

A gate electrode 12 is provided on the gate insulating film 13 so as to face the channel region 2, and the source electrode 19 and the drain electrode 20 are extended through respective contact holes 39. The gate electrode 12, the source electrode 19, and the drain electrode 20 are covered by a protective film 36.

FIG. 16 is a cross-sectional view of a channel etch coplanar type TFT 1. In this TFT 1, a semiconductor layer 3 is formed on a glass substrate 11. The semiconductor layer 3 is formed by sequentially forming a microcrystalline Si film 15 and a first a-Si film 14 in this order. A source region 4 and a drain region 5 are formed on the semiconductor layer 3 at a predetermined distance from each other. A gate insulating film 13 is formed so as to cover the source region 4, the drain region 5, and the semiconductor layer 3. In other words, the first a-Si film 14 forms an interface of the semiconductor layer 3 with the gate insulating film 13.

A gate electrode 12 is formed on the gate insulating film 13 so as to face a channel region 2 between the source region 4 and the drain region 5. A source electrode 19 or a drain electrode 20 is formed on the gate insulating film 13 so as to be connected to the source region 4 or the drain region S through a respective contact hole 39. The gate electrode 12, the source electrode 19, and the drain electrode 20 are covered by a protective film 36.

As described above, even when the present invention is applied to a top gate structure, the first a-Si film 14 forms the interface of the semiconductor layer 3 with the gate insulating film 13, whereby the same effects as those of the first embodiment can be obtained. The crystallization ratio of the microcrystalline Si film 15 tends to increase with increase in thickness of the microcrystalline Si film 15. Since the region having a high crystallization ration is provided closer to the interface with the gate insulating film, the mobility can be improved over the bottom gate structure.

In the first and second embodiments, the active matrix substrate 42 of a liquid crystal display device is described as a semiconductor device. However, the present invention is not limited to this, and the present invention is similarly applicable to an active matrix substrate of an organic EL display device. Moreover, the TFT 1 is applicable not only to a TFT 1 as a switching element of a pixel, but also to a switching element of, for example, a gate driver and an organic EL display device.

INDUSTRIAL APPLICABILITY

As has been described above, the present invention is useful for a semiconductor device, a manufacturing method thereof, and a display device. The present invention is suitable especially to form an excellent interface between a layer including a channel region and a gate insulating film and to improve the carrier mobility in the channel region.

The invention claimed is:

1. A semiconductor device, comprising:
a semiconductor layer having a channel region;
an impurity layer having a source region and a drain region; and
a gate electrode provided so as to face the semiconductor layer with a gate insulating film interposed therebetween, wherein
the semiconductor layer has a layered structure of at least a first amorphous film, a crystalline film including a crystal phase and formed on the first amorphous film, and a second amorphous film, having a thickness greater than that of the first amorphous film, formed on the crystalline film,
the first amorphous film is in direct contact with the gate insulating film, and
the impurity layer is in direct contact with the second amorphous film.

2. The semiconductor device according to claim 1, wherein the gate electrode is formed on an insulating substrate, and the semiconductor device has a bottom gate structure in which the semiconductor layer is formed over the insulating substrate so as to cover the gate electrode and at least a part of the gate insulating film.

3. The semiconductor device according to claim 1, wherein the semiconductor layer is made of silicon.

4. The semiconductor device according to claim 1, wherein the crystalline film is made of microcrystalline silicon of a columnar crystal extending perpendicularly to a surface of the crystalline film.

5. The semiconductor device according to claim 4, wherein the columnar crystal has a diameter of 10 nm to 40 nm in cross section.

6. The semiconductor device according to claim 1, wherein the first amorphous layer is made of amorphous silicon.

7. The semiconductor device according to claim 1, wherein the gate insulating film is made of a silicon nitride film.

8. The semiconductor device according to claim 1, wherein the first amorphous film has a thickness of 5 nm to 30 nm.

9. The semiconductor device according to claim 1, wherein the impurity layer has a layered structure of at least an amorphous first layer and a second layer including a crystal phase.

10. The semiconductor device according to claim 1, wherein the impurity layer has a layered structure of at least a low impurity layer and a high impurity layer.

11. The semiconductor device according to claim 1, wherein a spectrum of the first amorphous film detected by an FT-IR method has an absorption peak at 2,000 cm$^{-1}$ and an absorption peak at 2,100 cm$^{-1}$, and a ratio of the absorption peak at 2,000 cm$^{-1}$ in the detected spectrum is 75% or higher.

12. A display device, comprising:
a first substrate having a plurality of thin film transistors formed thereon, and a second substrate provided so as to face the first substrate with a display medium interposed therebetween, wherein
each of the thin film transistors includes,
a semiconductor layer having a channel region,
an impurity layer having a source region and a drain region, and
a gate electrode provided so as to face the semiconductor layer with a gate insulating film interposed therebetween,
the semiconductor layer has a layered structure of at least a first amorphous film, a crystalline film including a crystal phase and formed on the first amorphous film, and a second amorphous film, having a thickness greater than that of the first amorphous film, formed on the crystalline film,
the first amorphous film is formed directly on the gate insulating film, and
the impurity layer is in direct contact with the second amorphous film.

13. The display deice according to claim 12, wherein the gate electrode is formed on an insulating substrate, and each of the plurality of thin film transistors has a bottom gate structure in which the semiconductor layer is formed over the insulating substrate so as to cover the gate electrode and at least a part of the gate insulating film.

14. The display device according to claim 12, wherein the semiconductor layer is made of silicon.

15. The display device according to claim 12, wherein the crystalline film is made of microcrystalline silicon of a columnar crystal extending perpendicularly to a surface of the crystalline film.

16. The display device according to claim 15, wherein the columnar crystal has a diameter of 10 nm to 40 nm in cross section.

17. The display device according to claim 12, wherein the first amorphous layer is made of amorphous silicon.

18. The display device according to claim 12, wherein the gate insulating film is made of a silicon nitride film.

19. The display device according to claim 12, wherein the first amorphous film has a thickness of 5 nm to 30 nm.

20. The display device according to claim 12, wherein the impurity layer has a layered structure of at least an amorphous first layer and a second layer including a crystal phase.

21. The display device according to claim 12, wherein the impurity layer has a layered structure of at least a low impurity layer and a high impurity layer.

22. The display device according to claim 12, wherein a spectrum of the first amorphous film detected by an FT-IR method has an absorption peak at 2,000 cm$^{-1}$ and an absorption peak at 2,100 cm$^{-1}$, and a ratio of the absorption peak at 2,000 cm$^{-1}$ in the detected spectrum is 75% or higher.

* * * * *